US012777929B2

(12) United States Patent
Masuda et al.

(10) Patent No.: US 12,777,929 B2
(45) Date of Patent: Oct. 27, 2026

(54) SEMICONDUCTOR DEVICE

(71) Applicant: FUJI ELECTRIC CO., LTD., Kawasaki (JP)

(72) Inventors: Shinichi Masuda, Matsumoto-city (JP); Takuya Yamamoto, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 415 days.

(21) Appl. No.: 18/584,127

(22) Filed: Feb. 22, 2024

(65) Prior Publication Data

US 2024/0379485 A1 Nov. 14, 2024

(30) Foreign Application Priority Data

May 11, 2023 (JP) ................................ 2023-078328

(51) Int. Cl.
*H10W 40/22* (2026.01)
*H10W 90/00* (2026.01)

(52) U.S. Cl.
CPC ........... *H10W 40/22* (2026.01); *H10W 90/00* (2026.01); *H10W 90/734* (2026.01)

(58) Field of Classification Search
None
See application file for complete search history.

(56) References Cited

U.S. PATENT DOCUMENTS

| | | | | |
|---|---|---|---|---|
| 2006/0258055 A1 | 11/2006 | Okamoto | | |
| 2015/0130042 A1 | 5/2015 | Sato | | |
| 2018/0145007 A1* | 5/2018 | Hatano | ................ | H10W 40/22 |
| 2022/0367372 A1* | 11/2022 | Isozaki | ................ | H10W 40/10 |

FOREIGN PATENT DOCUMENTS

| | | |
|---|---|---|
| JP | 2002-368192 A | 12/2002 |
| JP | 2003-243648 A | 8/2003 |
| JP | 2006-319146 A | 11/2006 |
| WO | 2013/141154 A1 | 9/2013 |
| WO | 2022/044541 A1 | 3/2022 |

* cited by examiner

*Primary Examiner* — Xiaoming Liu
(74) *Attorney, Agent, or Firm* — Rabin & Berdo, P.C.

(57) ABSTRACT

A semiconductor device includes first and second semiconductor chips disposed away from each other by a chip distance on an insulated circuit board. A lower limit of the chip distance between the first and second semiconductor chips is set based on a first distance where a minimum thermal resistance of a heat dissipation path from a heat generation point on the front surface of the first semiconductor chip to a heat dissipation point on the bottom surface of the board is achieved with respect to the chip width of the first and second semiconductor chips. The heat dissipation point is positioned at the bottom surface of the board directly under a midpoint between the first and second semiconductor chips in side view.

10 Claims, 10 Drawing Sheets

SEMICONDUCTOR DEVICE

CROSS-REFERENCE TO RELATED APPLICATION

This application is based upon and claims the benefit of priority of the prior Japanese Patent Application No. 2023-078328, filed on May 11, 2023, the entire contents of which are incorporated herein by reference.

BACKGROUND OF THE INVENTION

1. Field of the Invention

The embodiment discussed herein relates to a semiconductor device.

2. Background of the Related Art

A semiconductor device includes an insulated circuit board in which a base plate, a resin layer, and a circuit pattern are sequentially stacked, and also includes a semiconductor chip bonded on the circuit pattern. A side edge portion of the semiconductor chip is disposed on the inner side of a peripheral edge portion of the circuit pattern by a predetermined distance or more. In this way, the semiconductor chip does not interfere with a thermal diffusion portion of the circuit pattern, and the circuit pattern is able to efficiently dissipate the heat generated by the semiconductor chip (for example, see International Publication Pamphlet No. WO 2022/044541).

When a plurality of semiconductor chips are connected in parallel, the distance between semiconductor chips is set to be shorter than the distance between a semiconductor chip and a heat sink. In addition, a transient thermal impedance decrease material or a transient thermal impedance increase material is disposed between a semiconductor chip and a supporting member to which the heat sink is attached. In this way, the transient thermal impedance between semiconductor chips becomes less than the transient thermal impedance between the semiconductor chip and the heat sink (for example, see Japanese Laid-open Patent Publication No. 2003-243648).

In addition, when a plurality of semiconductor chips are connected in parallel, semiconductor chips including switching elements are disposed in a staggered pattern, and semiconductor chips including diode elements are each disposed between two of the semiconductor chips including the switching elements. In this way, it is possible to diffuse the heat generated by the semiconductor chips efficiently (for example, see Japanese Laid-open Patent Publication No. 2002-368192).

A metal base includes a thin top plate portion, peripheral portions thicker than the top plate portion, and heat dissipation fins formed on the rear surface of the top plate portion. A plurality of semiconductor chips are disposed on the top plate portion of the metal base via an insulating board. This metal base provides good heat dissipation, reduces the thermal resistance, and prevents the thermal interference among the plurality of semiconductor chips (for example, see International Publication Pamphlet No. WO 2013/141154).

In addition, the thermal flow generated from a power semiconductor device normally has the property of diffusing and spreading at 45 degrees diagonally (for example, see Japanese Laid-open Patent Publication No. 2006-319146).

SUMMARY OF THE INVENTION

In one aspect of the embodiment, there is provided a semiconductor device, including: a board which has a top surface and a bottom surface that is opposite to the top surface; a first semiconductor chip which has a rectangular first front surface and a first side surface that constitutes one of four sides of the first front surface in a plan view of the semiconductor device, the first semiconductor chip being bonded to the top surface of the board with the first side surface facing in a first direction, the first side surface having a predetermined chip width in a second direction perpendicular to the first direction; and a second semiconductor chip which has a rectangular second front surface and a second side surface that constitutes one of four sides of the second front surface in the plan view, the second semiconductor chip being bonded to the top surface of the board with the second side surface facing in the first direction, the second side surface having the predetermined chip width in the second direction, wherein the first and second semiconductor chips are disposed away from each other by a chip distance in the second direction, and a lower limit of the chip distance is set based on a first distance, where a minimum thermal resistance of a heat dissipation path from a heat generation point on the first front surface of the first semiconductor chip to a heat dissipation point on the bottom surface of the board is achieved with respect to the chip width, the heat dissipation point being positioned at the bottom surface of the board directly below a midpoint between the first and second semiconductor chips in the second direction in a side view of the semiconductor device.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, an embodiment will be described with reference to the accompanying drawings. In the following description, regarding a semiconductor device 1 in FIG. 1, terms "front surface" and "top surface" each express an X-Y surface facing upward (the +Z direction). Likewise, regarding the semiconductor device 1 in FIG. 1, a term "up" expresses the upper direction (the +Z direction). Regarding the semiconductor device 1 in FIG. 1, terms "rear surface" and "bottom surface" each express an X-Y surface facing downward (the −Z direction). Likewise, regarding the semiconductor device 1 in FIG. 1, a term "down" expresses the lower direction (the −Z direction). In all the other drawings, the above terms also mean their respective directions, as appropriate. In addition, regarding the semiconductor device 1 in FIG. 1, an expression "upper level" means an upper location (the +Z direction). Likewise, regarding the semiconductor device 1 in FIG. 1, an expression "lower level" means a lower location (the −Z direction). The terms "front surface", "top surface", "up", "rear surface", "bottom surface", "down", and "side surface" are simply used as convenient expressions to determine relative positional relationships and do not limit the technical ideas of the embodiment. For example, the terms "up" and "down" may mean directions other than the vertical directions with respect to the ground. That is, the directions expressed by "up" and "down" are not limited to the directions relating to the gravitational force. In addition, in the following description, when a component contained in a material represents 80 vol % or more of the material, this component will be referred to as "main component" of the material. In addition, an expression "approximately the same" may be used when an error between two elements is within in ±10%. In addition, even when two elements are not exactly perpendicular, orthogonal, or parallel to each other, the two elements may be described as being "perpendicular", "orthogonal", or "parallel" to each other if the error is within ±10°.

Figure 1:
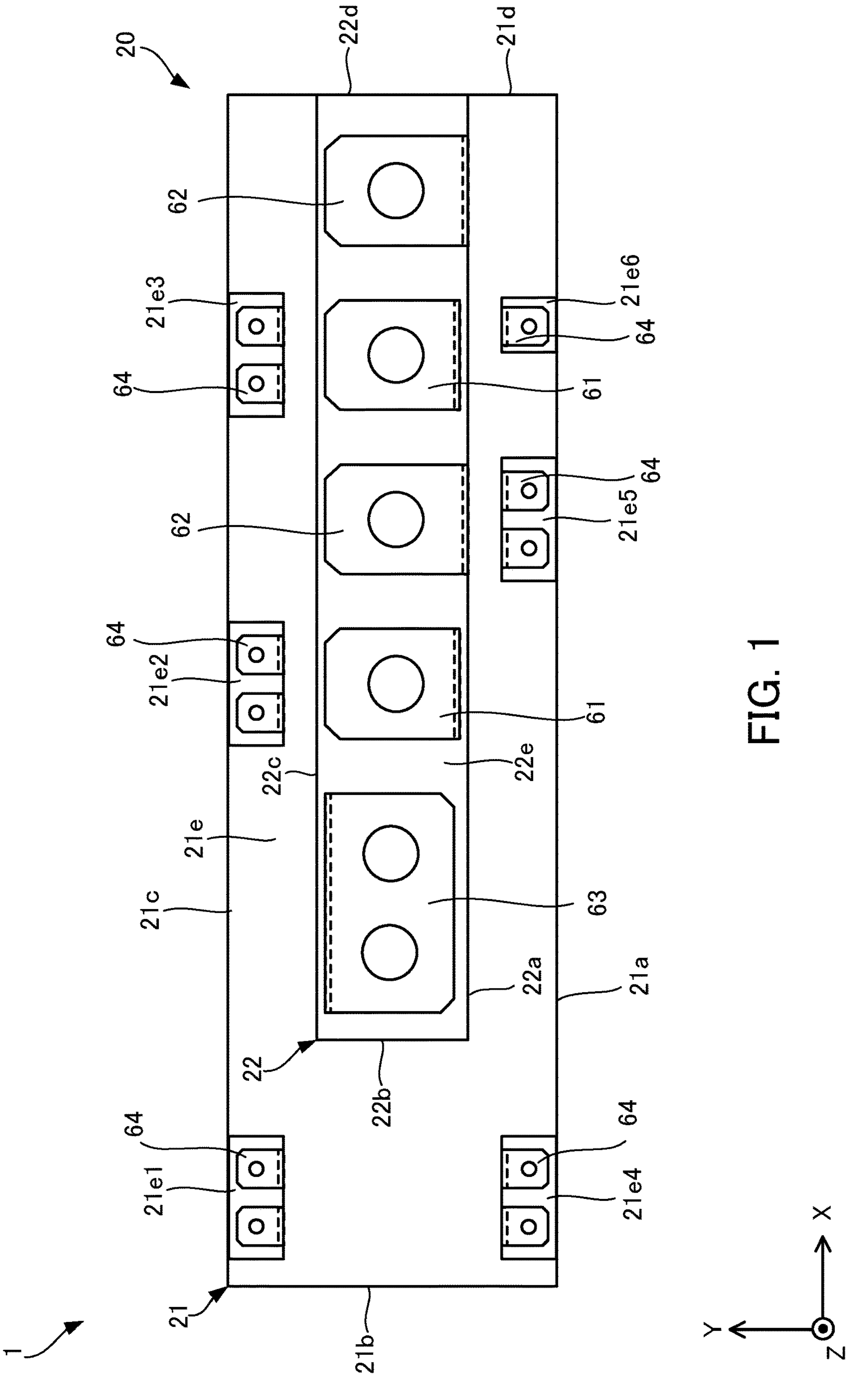
FIG. 1 is a plan view of a semiconductor device according to an embodiment.
Figure 2:
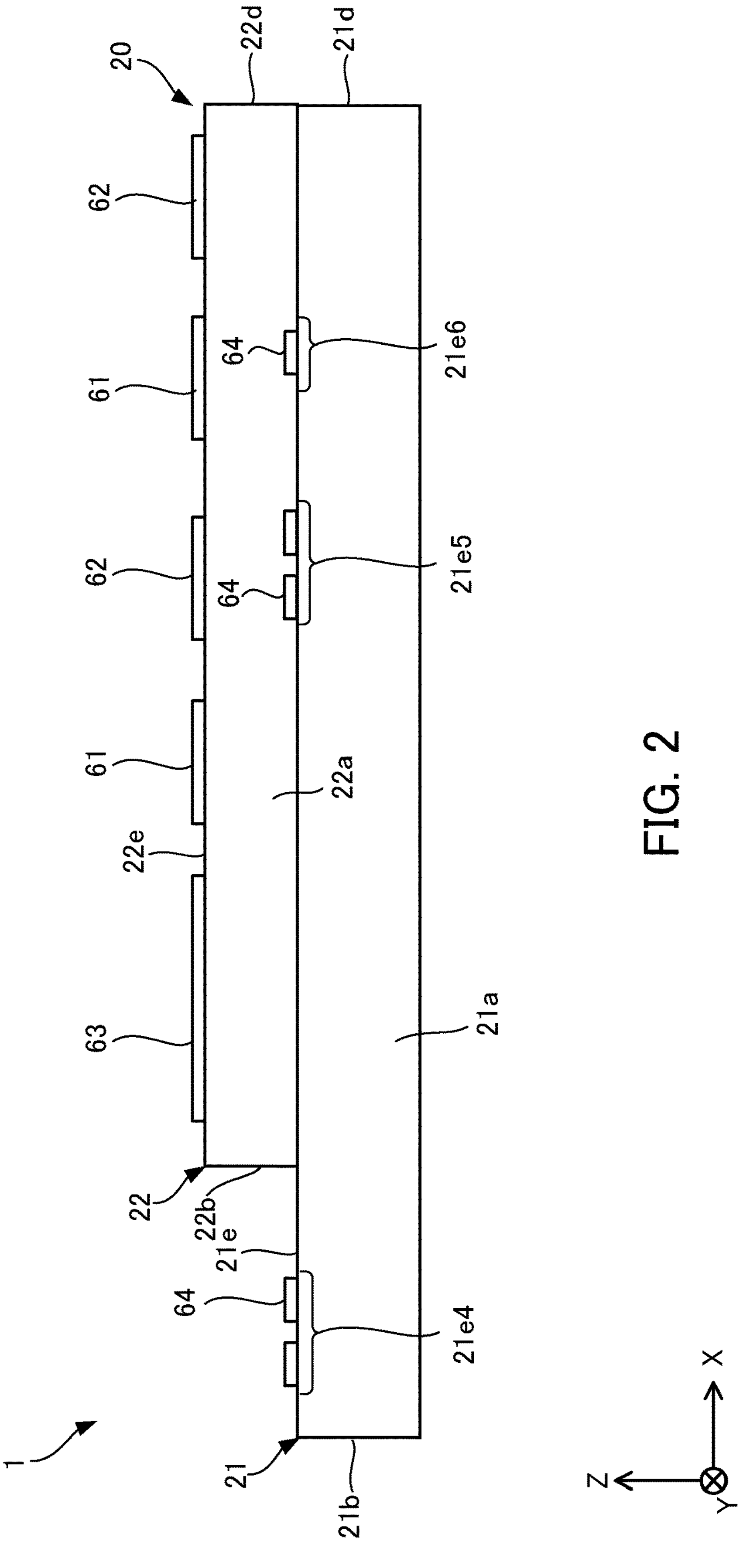
FIG. 2 is a side view of the semiconductor device according to the embodiment.
Figure 3:
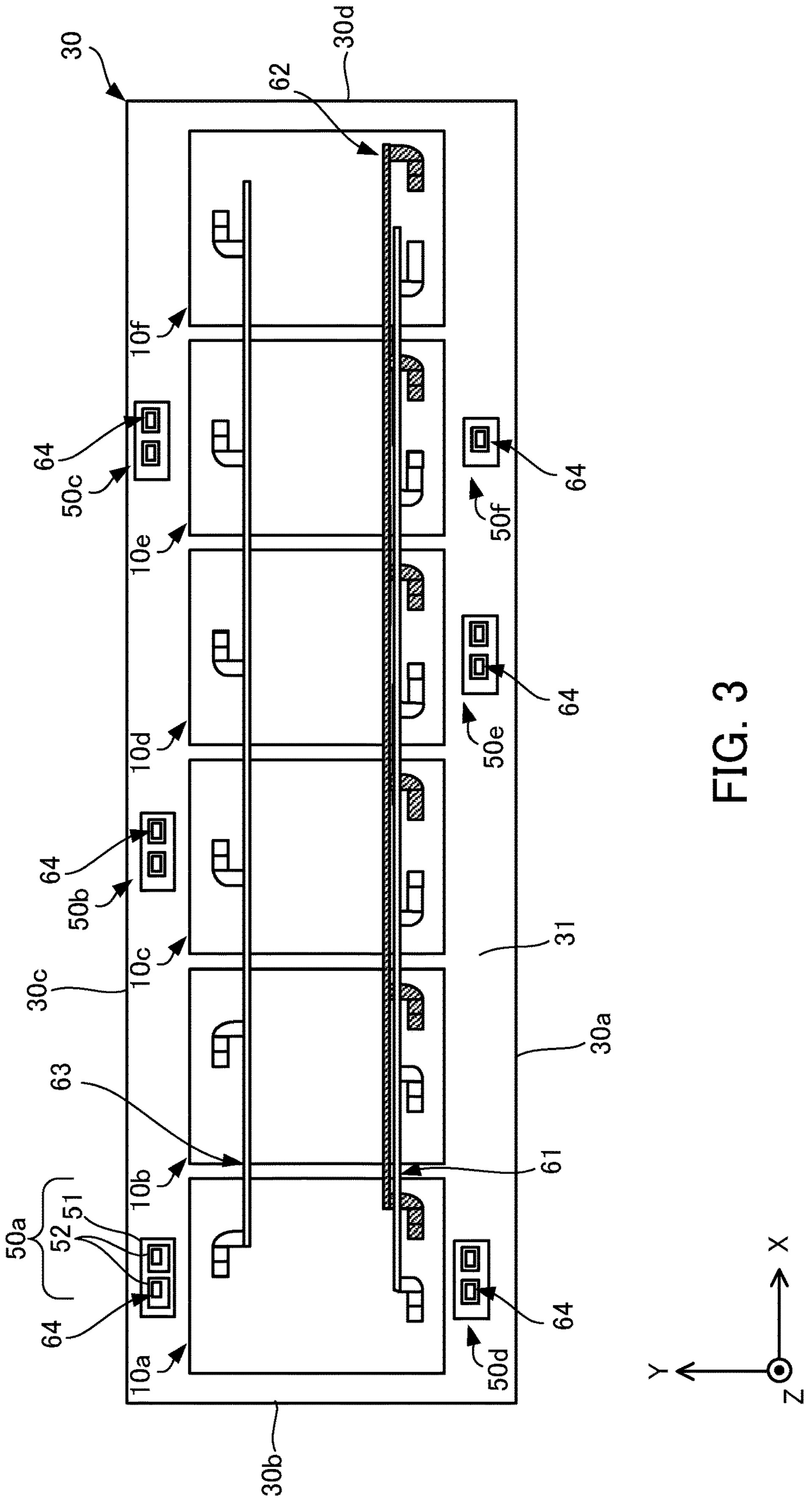
FIG. 3 is a plan view of the inside of the semiconductor device according to the embodiment.

The semiconductor device 1 according to the present embodiment will be described with reference to FIGS. 1 to 3. FIG. 1 is a plan view of the semiconductor device according to the embodiment. FIG. 2 is a side view of the semiconductor device according to the embodiment. FIG. 3 is a plan view of the inside of the semiconductor device according to the embodiment. FIG. 2 is a side view in which the semiconductor device 1 in FIG. 1 is seen in the +Y direction. FIG. 3 is a plan view of the semiconductor device 1 in FIG. 1 from which a case 20 has been removed. Although FIG. 3 illustrates the semiconductor device 1, conductive plates constituting circuit patterns, semiconductor chips, and wires are not illustrated.

The semiconductor device 1 includes the case 20. The case 20 is attached to a heat dissipation base board 30 on which semiconductor units 10*a* to 10*f*, which will be described below, are bonded. When the case 20 is attached to the heat dissipation base board 30, the semiconductor units 10*a* to 10*f* are stored in the case 20. The case 20 includes a lower storage portion 21 and an upper storage portion 22.

The lower storage portion 21 has a rectangular shape. In plan view, four sides of the lower storage portion 21 constitute a long side wall 21*a*, a short side wall 21*b*, a long side wall 21*c*, and a short side wall 21*d*. In addition, the lower storage portion 21 includes a lower front surface 21*e* in the opening surrounded by the long side wall 21*a*, the short side wall 21*b*, the long side wall 21*c*, and the short side wall 21*d*.

The lower front surface 21*e* includes control terminal areas 21*e*1 to 21*e*6. The control terminal area 21*e*1 is located near the short side wall 21*b* on the lower front surface 21*e* and at an edge portion of the long side wall 21*c*. The control terminal area 21*e*2 is located at an edge portion of the long side wall 21*c* on the lower front surface 21*e*, and is located approximately in the center of the long side wall 21*c*. The control terminal area 21*e*3 is located at an edge portion of the long side wall 21*c* on the lower front surface 21*e*, and is located between the control terminal area 21*e*2 and the short side wall 21*d*. The control terminal area 21*e*4 is located near the short side wall 21*b* on the lower front surface 21*e* and at an edge portion of the long side wall 21*a*, and faces the control terminal area 21*e*1. The control terminal area 21*e*5 is located at an edge portion of the long side wall 21*a* on the lower front surface 21*e*, and is located between the control terminal areas 21*e*2 and 21*e*3 in side view. The control terminal area 21*e*6 is located at an edge portion of the long side wall 21*a* on the lower front surface 21*e*, and faces the control terminal area 21*e*3 in side view. Control wiring members 64 are bent to appear in these control terminal areas 21*e*1 to 21*e*6. In addition, nuts are located to face the bent wiring members 64 in the control terminal areas 21*e*4 to 21*e*6.

The upper storage portion 22 also has a rectangular shape. In plan view, four sides of the upper storage portion 22 constitute a long side wall 22*a*, a short side wall 22*b*, a long side wall 22*c*, and a short side wall 22*d*. In addition, the upper storage portion 22 includes an upper front surface 22*e* in the opening surrounded by the long side wall 22*a*, the short side wall 22*b*, the long side wall 22*c*, and the short side wall 22*d*. The upper storage portion 22 is located in the center portion of the lower front surface 21*e* of the lower storage portion 21 in the ±Y directions, and the short side wall 22*d* and the short side wall 21*d* are on the same plane. The lower front surface 21*e* of the lower storage portion 21 has an opening in which the upper storage portion 22 is formed.

An output wiring member 63, a positive wiring member 61, a negative wiring member 62, a positive wiring member 61, and a negative wiring member 62 (connection portions thereof) are formed on the upper front surface 22*e* in the direction from the short side wall 22*b* to the short side wall 22*d* (in the +X direction). The output, positive, negative, positive, and negative wiring members 63, 61, 62, 61, and 62 are also bent to extend along the upper front surface 22*e*. In this case, as illustrated in FIG. 1, the output wiring member 63 is bent in the −Y direction. The positive, negative, positive, and negative wiring members 61, 62, 61, and 62 are bent in the +Y direction. Nuts facing the wiring members 63, 61, 62, 61, and 62 are also stored in the upper front surface 22*e*.

The case 20 having the above-described construction is made of thermoplastic resin. Examples of the thermoplastic resin include polyphenylene sulfide resin, polybutylene terephthalate resin, polybutylene succinate resin, polyamide resin, and acrylonitrile butadiene styrene resin.

As illustrated in FIG. 3, the semiconductor device 1 includes the heat dissipation base board 30, the plurality of semiconductor units 10*a* to 10*f*, control wiring units 50*a* to 50*f*, and the positive, negative, and output wiring members 61, 62, and 63 formed on the heat dissipation base board 30. The semiconductor units 10*a* to 10*f* each have the same construction, and detailed description and illustration thereof will be simplified. Hereinafter, when these semiconductor units 10*a* to 10*f* are not distinguished from each other, each of these semiconductor units 10*a* to 10*f* will be referred to as a semiconductor unit 10. In addition, when the control wiring units 50*a* to 50*f* are not distinguished from each other, each of these control wiring units 50*a* to 50*f* will be referred to as a control wiring unit 50.

The case 20 is attached onto the heat dissipation base board 30 of the semiconductor device 1. The case 20 covers the semiconductor units 10, the control wiring units 50, and the wiring members 61, 62, and 63 on the heat dissipation base board 30.

Figure 4:
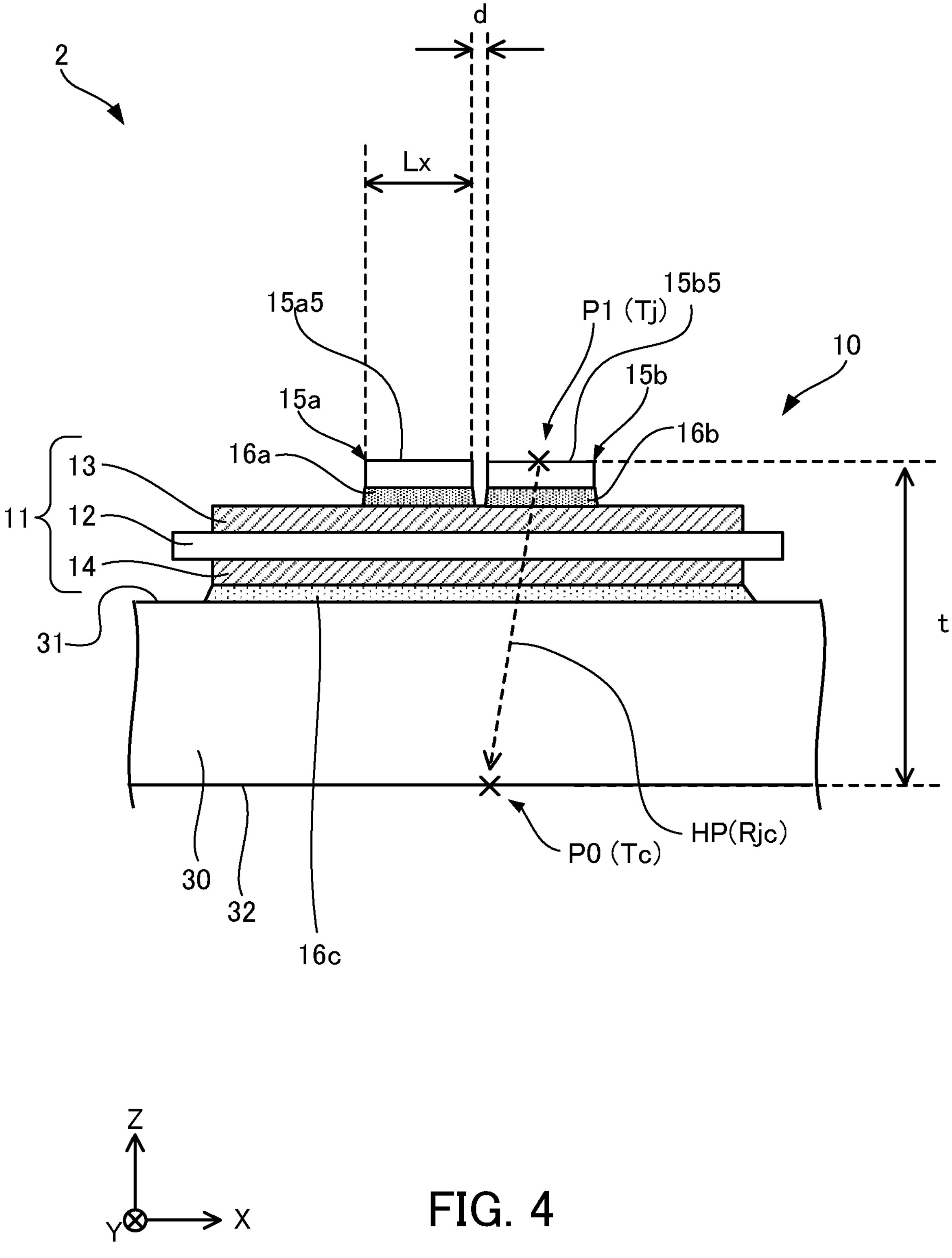
FIG. 4 is a sectional view of a semiconductor unit included in the semiconductor device according to the embodiment.

The heat dissipation base board 30 includes a top surface 31 and a bottom surface 32, each of which has a rectangular shape in plan view (see FIG. 4). The four sides of the top surface 31 are surrounded by a long side 30*a*, a short side 30*b*, a long side 30*c*, and a short side 30*d* of the heat dissipation base board 30. The heat dissipation base board 30 is made of a metal material having an excellent thermal conductivity. For example, this metal material is aluminum, iron, silver, copper, magnesium, or an alloy containing at least one of these kinds of elements. The heat dissipation base board 30 according to the present embodiment is made of a metal material containing copper as its main component. The surface of the heat dissipation base board 30 may be plated to improve its corrosion resistance. The material used for this plating is, for example, nickel, a nickel-phosphorus alloy, or a nickel-boron alloy. A cooler (not illustrated) may be attached to the bottom surface 32 of the heat dissipation base board 30 of the semiconductor device 1 via thermal grease. In this way, the heat dissipation of the semiconductor device 1 is improved. For example, this cooler may be made of aluminum, iron, silver, copper, or an alloy containing at least one of these kinds of elements having an excellent thermal conductivity. Examples of the cooler include a heat sink and a water-cooled cooling device. The heat sink may include a plurality of fins. The plurality of fins may be formed directly on the bottom surface 32 of the heat dissipation base board 30. Examples of the thermal grease include silicone containing metal-oxide filler.

The wiring members 61, 62, and 63 are positive, negative, and output wirings connected to the semiconductor units 10*a* to 10*f*. Each of the wiring members 61, 62, and 63 is in parallel with the long sides 30*a* and 30*c* of the heat dissipation base board 30 and extends from the semiconductor unit 10*a* to the semiconductor unit 10*f*. These wiring members 61, 62, and 63 are electrically and mechanically bonded to each of the semiconductor units 10*a* to 10*f*. This bonding may be made by solder or ultrasonic bonding, for example. The wiring members 61, 62, and 63 include connection portions (not illustrated). When the case 20 is attached to the heat dissipation base board 30, these connection portions of the wiring members 61, 62, and 63 are extracted from the upper front surface 22*e* of the upper storage portion 22 of the case 20 and are bent.

These wiring members 61, 62, and 63 are made of a metal material having an excellent electrical conductivity. The metal material may be silver, copper, nickel, or an alloy containing at least one of these kinds of elements, for example. The surface of the wiring members 61, 62, and 63 may be plated to improve its corrosion resistance. The material used for this plating is, for example, nickel, a nickel-phosphorus alloy, or a nickel-boron alloy.

The control wiring units 50*a*, 50*b*, and 50*c* are disposed on the heat dissipation base board 30 in the +Y direction of the semiconductor units 10*a*, 10*c*, and 10*e*, respectively, in FIG. 3. The control wiring units 50*d*, 50*e*, and 50*f* are disposed on the heat dissipation base board 30 in the −Y direction of the semiconductor units 10*a*, 10*d*, and 10*e*, respectively, in FIG. 3.

These control wiring units 50 each include an insulating plate 51, at least one wiring plate 52 formed on the insulating plate 51, a metal plate (not illustrated) formed on the rear surface of the insulating plate 51, and at least one control wiring member 64 bonded on the wiring plate 52. Among the control wiring units 50, the control wiring unit 50*f* may include a single wiring plate 52 and a single control wiring member 64 as a pair. The other control wiring units 50 may include two pairs of wiring plates 52 and control wiring members 64.

The insulating plate 51 is made of a ceramic material having a high thermal conductivity. For example, the ceramic material is a composite material containing aluminum oxide, to which zirconium oxide has been added, as its main component or is a material containing silicon nitride as its main component. The individual insulating plate 51 has a rectangular shape in plan view and may have rounded or chamfered corners.

The individual wiring plate 52 is made of a metal material having an excellent electrical conductivity. The metal material is, for example, silver, copper, nickel, or an alloy containing at least one of these kinds of elements. The surface of the individual wiring plate 52 may be plated to improve its corrosion resistance. The material used for this plating is, for example, nickel, a nickel-phosphorus alloy, or a nickel-boron alloy. The individual wiring plate 52 may be formed on a corresponding insulating plate 51 by forming a metal plate on the front surface of the insulating plate 51 and performing etching or the like on this metal plate. Alternatively, a wiring plate 52 may previously be cut out of a metal plate, and this wiring plate 52 may be bonded to the front surface of a corresponding insulating plate 51 by applying pressure. The wiring plates 52 illustrated in FIG. 3 are examples. The number of wiring plates 52 may be suitably selected, depending on the need. The shape, the size, etc., of the wiring plates 52 may also be suitably selected, depending on the need.

The control wiring members 64 are made of a metal material having an excellent electrical conductivity. The metal material is, for example, silver, copper, nickel, or an alloy containing at least one of these kinds of elements. The surface of the individual wiring member 64 may be plated to improve its corrosion resistance. The material used for this plating is, for example, nickel, a nickel-phosphorus alloy, or a nickel-boron alloy. These wiring members 64 have a strip-like shape and have approximately the same overall thickness.

The lower end portion of the individual wiring member 64 is bonded to a corresponding wiring plate 52. This bonding is made by the above-described bonding member or ultrasonic bonding. When the case 20 is attached to the heat dissipation base board 30, the wiring members 64 are extracted from (inserted into) the control terminal areas 21*e*1 to 21*e*6 of the case 20, and the extracted portions are bend.

Figure 5:
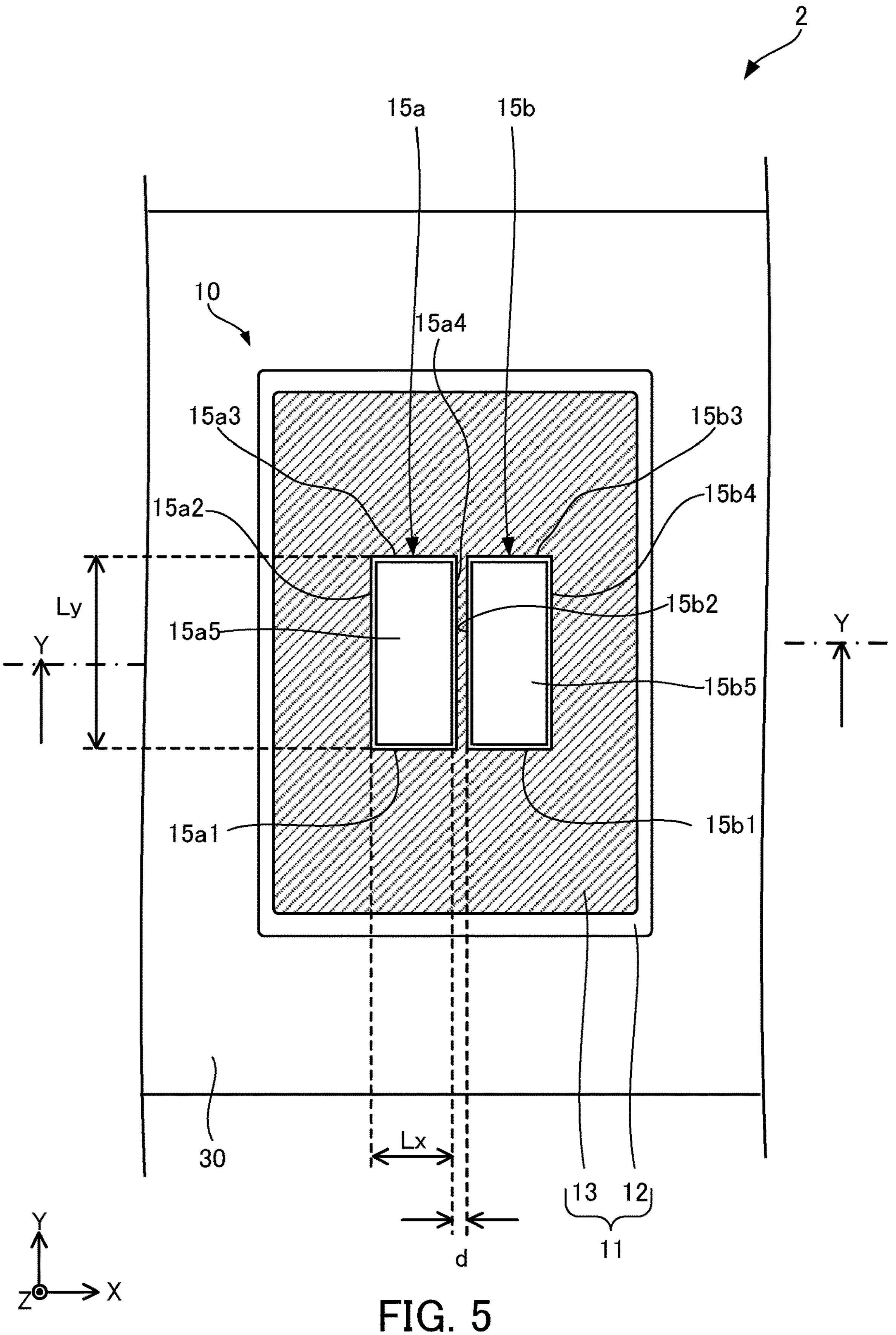
FIG. 5 is a plan view of the semiconductor unit included in the semiconductor device according to the embodiment.

Next, a semiconductor unit 10 included in the semiconductor device 1 will be described with reference to FIGS. 4 and 5. FIG. 4 is a sectional view of a semiconductor unit included in the semiconductor device according to the embodiment, and FIG. 5 is a plan view of the semiconductor unit included in the semiconductor device according to the embodiment. FIG. 4 is a sectional view taken along a dashed-dotted line Y-Y in FIG. 5.

Each of the semiconductor units 10 includes at least an insulated circuit board 11 (an insulating board) and semiconductor chips 15*a* and 15*b* (first and second semiconductor chips). A single semiconductor unit 10 and the heat dissipation base board 30 to which this single semiconductor unit 10 is bonded will be referred to as a target device 2 (For example, the insulated circuit board 11 and the heat dissipation base board 30 will be referred to as a board).

The insulated circuit boards 11 are aligned along the long sides 30*a* and 30*c* of the heat dissipation base board 30 on the top surface 31 of the heat dissipation base board 30. Each of the insulated circuit boards 11 may be bonded to the top surface 31 of the heat dissipation base board 30 via a bonding member 16*c* (a first bonding member). For example, the bonding member 16*c* is solder, brazing material, or sintered metal. Lead-free solder is used as the solder. The main component of the lead-free solder is, for example, an alloy containing at least two of tin, silver, copper, zinc, antimony, indium, and bismuth. The solder may contain additive, which is, for example, nickel, germanium, cobalt, or silicon. Since solder containing such additive as described above has improved wettability, luster, and bonding strength, the reliability is improved. For example, the main component of the brazing material is at least one of an aluminum alloy, a titanium alloy, a magnesium alloy, a zirconium alloy, and a silicon alloy. Each of the insulated circuit boards 11 may be bonded to the heat dissipation base board 30 by brazing using the bonding member 16*c*. The sintered material used for the sintered metal is, for example, powders of silver, iron, copper, aluminum, titanium, nickel, tungsten, molybdenum, or an alloy containing any one of these elements. Solder is used as the bonding member 16*c* in the semiconductor device 1.

The individual insulated circuit board 11 includes an insulating plate 12, a conductive plate 13 formed on the front surface of the insulating plate 12, and a metal plate 14 formed on the rear surface of the insulating plate 12. The insulating plate 12 and the metal plate 14 have a rectangular shape in plan view and may have rounded or chamfered corners. The metal plate 14 is formed on the entire rear surface of the insulating plate 12, excepting the edge portions of the insulating plate 12 in plan view.

The main component of the insulating plate 12 is an insulating material having an excellent thermal conductivity. The material may be a ceramic material or an insulating resin. The ceramic material is, for example, aluminum oxide, aluminum nitride, or silicon nitride. The insulating resin is a paper phenol board, a paper epoxy board, a glass composite board, or a glass epoxy board, for example. In the semiconductor device 1 according to the present embodiment, a ceramic material is used for the insulating plate 12, and the main component of the ceramic material is aluminum nitride.

The main component of the conductive plate 13 is a metal material having an excellent electrical conductivity. For example, this metal material is copper, aluminum, or an alloy containing at least one of these kinds of elements as its main component. In the semiconductor device 1 according to the present embodiment, the main component of the conductive plate 13 is copper. The surface of the conductive plate 13 may be plated to improve its corrosion resistance. The material used for this plating is, for example, nickel, a nickel-phosphorus alloy, or a nickel-boron alloy. The conductive plate 13 according to the present embodiment is an example. The number of conductive plates 13 may be suitably selected, depending on the need. The shape, the size, etc., of the conductive plates 13 may also be suitably selected, depending on the need.

The metal plate 14 has a smaller area than the insulating plate 12 and has a rectangular shape, as with the insulating plate 12. In addition, the metal plate 14 may have rounded or chamfered corners. The metal plate 14 is smaller than the insulating plate 12 and is formed on the entire surface, excepting the edge portions of the insulating plate 12. The main component of the metal plate 14 is a metal material having an excellent thermal conductivity. The metal material may be, for example, copper, aluminum, or an alloy containing at least one of these kinds of elements. Plating may be performed to improve the corrosion resistance of the metal plate 14. The material used for this plating is, for example, nickel, a nickel-phosphorus alloy, or a nickel-boron alloy.

For example, a direct copper bonding (DCB) substrate, an active metal brazed (AMB) substrate, or an insulating resin substrate may be used as the insulated circuit board 11 having the above-described construction. In the case of the semiconductor device 1 according to the present embodiment, DCB substrates are used.

Each of the semiconductor chips 15*a* and 15*b* includes a switching element (an element). Examples of the switching element include an insulated gate bipolar transistor (IGBT), a reverse-conducting (RC)-IGBT, and a power metal-oxide-semiconductor field-effect transistor (MOSFET). The RC-IGBT is constituted by forming a circuit, in which an IGBT and a free-wheeling diode (FWD), which is a diode element, are connected in anti-parallel to each other, on one chip. If a switching element of the semiconductor chip 15*a* or 15*b* is an IGBT or an RC-IGBT, this semiconductor chip includes a collector electrode as an input electrode on its rear surface and includes a gate electrode as a control electrode and an emitter electrode as an output electrode on its front surface. If a switching element of the semiconductor chip 15*a* or 15*b* is a power MOSFET, this semiconductor chip includes a drain electrode as an input electrode on its rear surface and includes a gate electrode as a control electrode and a source electrode as an output electrode on its front surface. A power MOSFET whose body diode functions as an FWD may be used as a switching element. This power MOSFET is made of a material containing silicon carbide as its main component, for example. An IGBT or an RC-IGBT may be made of a material containing silicon as its main component. In the present embodiment, IGBTs are used in the semiconductor chips 15*a* and 15*b*. These semiconductor chips 15*a* and 15*b* are bonded on the conductive plate 13 via bonding members 16*a* (a second bonding member) and 16*b* (the second bonding member), respectively. Examples of the bonding members 16*a* and 16*b* include the above-described solder and sintered metal. In the present embodiment, solder is used as the bonding members 16*a* and 16*b*.

The semiconductor chips 15*a* and 15*b* have the same shape and size. That is, in plan view, the semiconductor chip 15*a* has a rectangular front surface 15*a*5 (a first front surface) and side surfaces 15*al* to 15*a*4 sequentially surrounding the four sides of the front surface 15*a*5. In addition, in plan view, the semiconductor chip 15*b* has a rectangular front surface 15*b*5 (a second front surface) and side surfaces 15*b*1 to 15*b*4 sequentially surrounding the four sides of the front surface 15*b*5.

The side surfaces 15*al* and 15*b*1 (examples of first and second side surfaces) of the semiconductor chips 15*a* and 15*b* face in the same direction (−Y direction (an example of a first direction)), are on the same plane, and are adjacent to each other. The side surfaces 15*a*3 and 15*b*3 (examples of the first and second side surfaces) face in the same direction (+Y direction (an example of the first direction)), are on the same plane, and are adjacent to each other. The side surface **15*a*4 of the semiconductor chip 15*a* and the side surface 15*b*2 of the semiconductor chip 15*b*** face each other with a distance d. This distance (chip distance) d will be described in detail below.

The ±Y direction length of the side surfaces **15*a*2, 15*a*4, 15*b*2, and 15*b*4 corresponding to the long sides of the semiconductor chips 15*a* and 15*b* will be referred to as a length Ly, and the ±X direction length of the side surfaces 15*a*1, 15*a*3, 15*b*1, and 15*b*3 corresponding to the short sides of the semiconductor chips 15*a* and 15*b*** will be referred to as a chip width Lx.

The conductive plate 13 is an example as described above, and a plurality of conductive plates 13 may be used. If a plurality of conductive plates 13 are used, the semiconductor chips **15*a* and 15*b* may be disposed on the same conductive plate 13**.

Hereinafter, simulation results about the thermal resistance with respect to the distance d between the semiconductor chips **15*a* and 15*b* will be described. In this simulation, various thermal resistances are obtained by changing the distance d. The simulation target is the target device 2 including the heat dissipation base board 30 and the semiconductor unit 10 bonded to the heat dissipation base board 30 as illustrated in FIG. 4**.

In the simulation on the target device 2, a current is caused to flow through the semiconductor chips **15*a* and 15*b* simultaneously for one second while changing the distance d, and thereafter, the individual thermal resistance of a heat dissipation path HP from a heat generation point P1 to a heat dissipation point P0** is analyzed.

When a current is caused to flow through the semiconductor chips **15*a* and 15*b*, first, a positive electrode and a negative electrode are connected to the input electrode (on the rear surface) and the output electrode (on the front surface) of each of the semiconductor chips 15*a* and 15*b*. Next, a control signal is applied to the control electrodes, and an output current is output from the output electrode of each of the semiconductor chips 15*a* and 15*b*. The semiconductor chips 15*a* and 15*b*** generate heat based on the output of their respective output currents. In this simulation, the thermal resistance of the individual heat dissipation path HP when the output current is output for one second is analyzed.

Figure 9A:
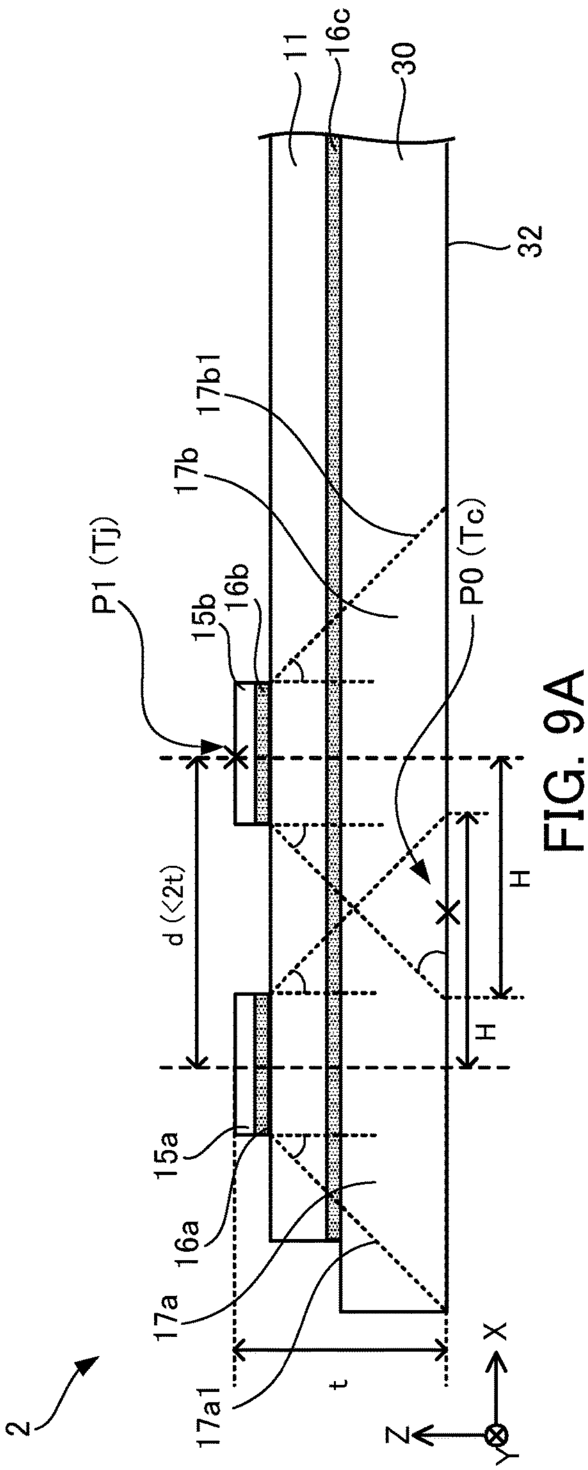
FIGS. 9A and 9B schematically illustrate the thermal diffusion in the target device included in the semiconductor device according to the embodiment.
Figure 9B:
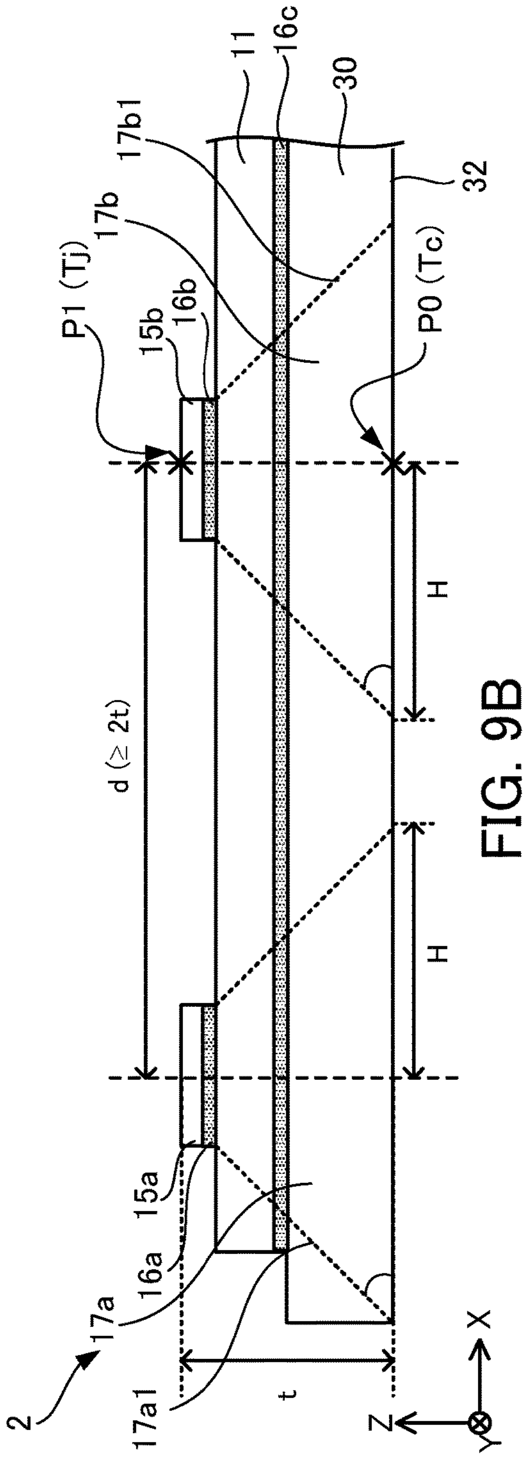

In addition, the heat diffuses from the rear surface of each of the heated semiconductor chips **15*a* and 15*b* toward the insulated circuit board 11 and the heat dissipation base board 30. As illustrated in FIGS. 9A and 9B, an outer most area 17*al* of a thermal diffusion portion 17*a*, in which the heat generated from the semiconductor chip 15*a* diffuses, forms, for example, 45° with the side surfaces 15*a*2 and 15*a*4 of the semiconductor chip 15*a*. In addition, an outer most area 17*b*1 of a thermal diffusion portion 17*b*, in which the heat generated from the semiconductor chip 15*b* diffuses, forms, for example, 45° with the side surfaces 15*b*2 and 15*b*4 of the semiconductor chip 15*b*. The heat from the rear surface of each of the semiconductor chips 15*a* and 15*b*** diffuses at 45° in this way. This diffusion angle 45° is only a heat diffusion range taken into account in the present embodiment. The heat diffusion range is not limited to 45°, e.g., a wider range may be set as the heat diffusion range.

As illustrated in FIGS. 9A and 9B, the area in which the heat generated from the semiconductor chip **15*a* is mainly the thermal diffusion portion 17*a* whose outer most area 17*al* forms, for example, 45° with the side surfaces 15*a*2 and 15*a*4 of the semiconductor chip 15*a*, and the area in which the heat generated from the semiconductor chip 15*b* is mainly the thermal diffusion portion 17*b* whose outer most area 17*b*1 forms, for example, 45° with the side surfaces 15*b*2 and 15*b*4 of the semiconductor chip 15*b*. The heat from the rear surface of each of the semiconductor chips 15*a* and 15*b*** mainly diffuses within this range at 45°. This diffusion angle 45° is only a main heat diffusion range, and a wider range may be taken into account in the present embodiment.

The individual heat generation point P1 is a point of the highest temperature on a corresponding one of the front surfaces **15*a*5 and 15*b*5 of the semiconductor chips 15*a* and 15*b* after the flowing of the current for one second. For the thermal resistance analysis, any one of the heat generation points P1 on the front surfaces 15*a*5 and 15*b*5 of the semiconductor chips 15*a* and 15*b* may be used. In this embodiment, only the heat generation point P1 on the front surface 15*b*5 of the semiconductor chip 15*b*** is illustrated.

The heat dissipation point P0 is a point of the highest temperature on the bottom surface 32 of the heat dissipation base board 30, and this point is located in the range directly under the combined area of the two semiconductor chips **15*a* and 15*b*. In the present embodiment, the heat dissipation point P0 is a point on the bottom surface 32, the point being directly under the midpoint between the semiconductor chips 15*a* and 15*b*** in side view.

The heat dissipation path HP is a path of the shortest distance from the heat generation point P1 to the heat dissipation point P0. In addition, the thickness from the bottom surface 32 of the heat dissipation base board 30 to the front surfaces **15*a*5 and 15*b*5 of the semiconductor chips 15*a* and 15*b* in side view of the target device 2** will be referred to as a laminate thickness t. In the present embodiment, the laminate thickness t is approximately 4.5 mm.

The thermal resistance (Rjc) is obtained by dividing (a temperature Tj of the heat generation point P1−a temperature Tc of the heat dissipation point P0) by the output power (W) of the target device 2. The present embodiment assumes that the output power (W) is determined by the semiconductor chips **15*a* and 15*b*. Thus, the thermal resistance (Rjc) depends on the difference between the temperature Tj of the heat generation point P1 and the temperature Tc of the heat dissipation point P0**.

Figure 6:
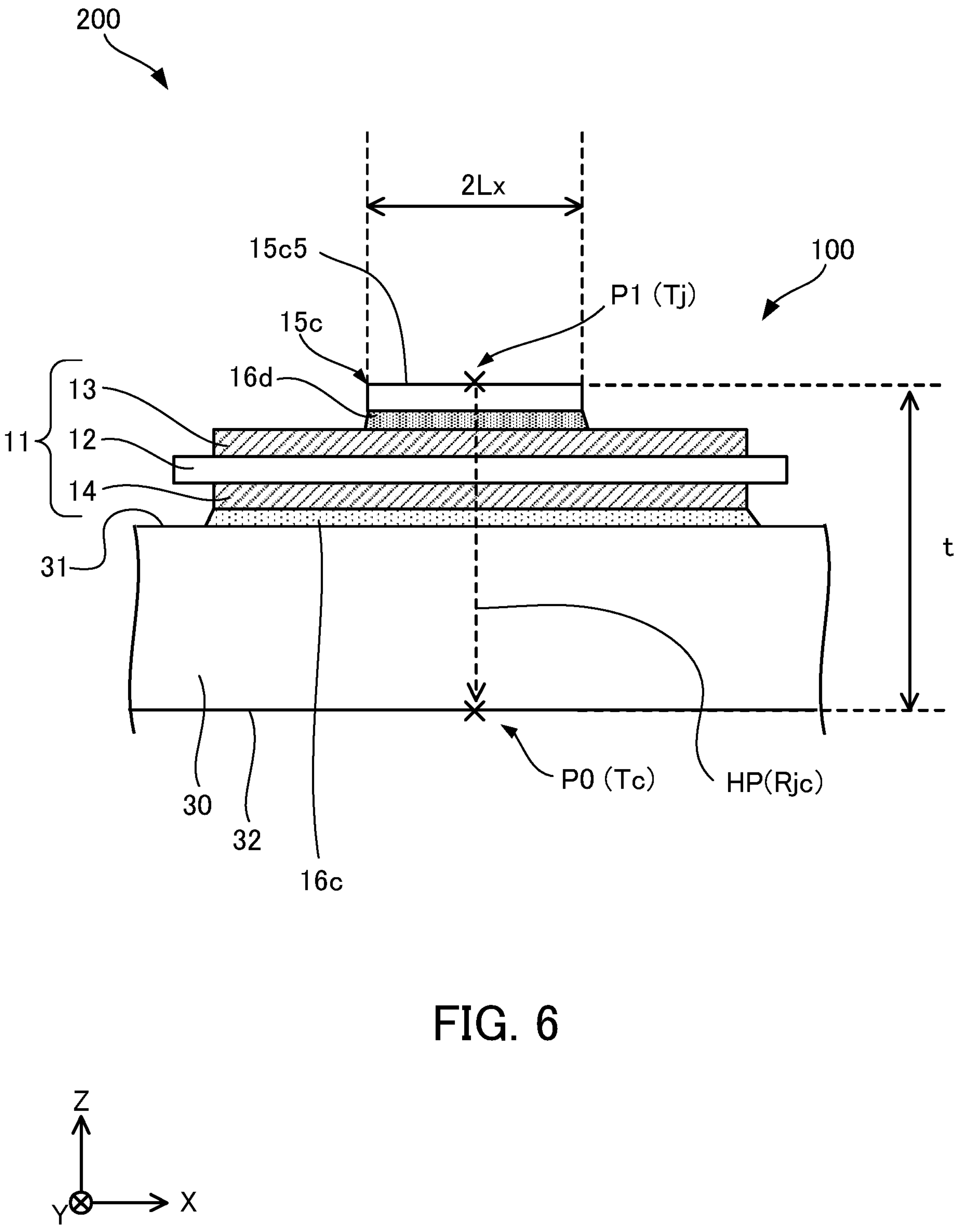
FIG. 6 is a sectional view of a semiconductor unit included in a semiconductor device according to a comparative example.

Next, a comparative example of the target device 2 will be described with reference to FIG. 6. FIG. 6 is a sectional view of a semiconductor unit included in a semiconductor device according to the comparative example. This target device 200 illustrated in FIG. 6 is similar to the target device 2 illustrated in FIGS. 4 and 5, and includes a heat dissipation base board 30 and a semiconductor unit 100 bonded to the heat dissipation base board 30 via a bonding member **16*c*. The heat dissipation base board 30 is the same as that illustrated in FIGS. 4 and 5**.

The semiconductor unit 100 includes an insulated circuit board 11 and a semiconductor chip **15*c* bonded to the insulated circuit board 11 via a bonding member 16*d*. The insulated circuit board 11 is the same as that illustrated in FIGS. 4 and 5. The bonding member 16*d* may be the same as the bonding members 16*a* and 16*b***.

The semiconductor chip **15*c* is an IGBT, as with the semiconductor chips 15*a* and 15*b*. However, the semiconductor chip 15*c* has a different size from that of the semiconductor chips 15*a* and 15*b*. The ±X direction length of the semiconductor chip 15*c* is twice the chip width Lx (2Lx) of the semiconductor chips 15*a* and 15*b*, and the ±Y direction length is Ly, which is the same as that of the semiconductor chips 15*a* and 15*b*. That is, the ±X direction length of the semiconductor chip 15***c* is a sum of the lengths of the chip widths Lx of the semiconductor chips 15*a* and 15*b*.

The size of the semiconductor chip 15*c* is equal to the sum of the sizes of the semiconductor chips 15*a* and 15*b*. In addition, the rated current of the semiconductor chip 15*c* is also the sum of the rated currents of the semiconductor chips 15*a* and 15*b*. That is, the rated current of each of the semiconductor chips 15*a* and 15*b* is half of the rated current of the semiconductor chip 15*c*.

The same simulation as that performed on the target device 2 is also performed on the target device 200, so as to analyze the thermal resistance of a heat dissipation path HP from a heat generation point P1 to a heat dissipation point P0 after a current is caused to flow through the semiconductor chip 15*c* for one second.

The flowing of the current through the semiconductor chip 15*c* is performed in the same way as the flowing of the current through the semiconductor chips 15*a* and 15*b*. The heat generation point P1 is a point of the highest temperature on a front surface 15*c*5 of the semiconductor chip 15*c* after the flowing of the current for one second. In the case of the semiconductor chip 15*c*, the heat generation point P1 is located approximately the center of the front surface 15*c*5.

The heat dissipation point P0 is a point of the highest temperature on a bottom surface 32 of the heat dissipation base board 30 in the range directly under the area of the semiconductor chip 15*c*. In this case, the heat dissipation point P0 is a point directly under the heat generation point P1 of the semiconductor chip 15*c* in side view of the bottom surface 32.

The heat dissipation path HP is a path of the shortest distance from the heat generation point P1 to the heat dissipation point P0. In addition, the thickness from the bottom surface 32 of the heat dissipation base board 30 to the front surface 15*c*5 of the semiconductor chip 15*c* in side view of the target device 200 is the laminate thickness t, as is the case with the target device 2. That is, the laminate thickness t of the target device 200 is also approximately 4.5 mm in the present embodiment.

Figures 7A, 7B, 7C, 7D:
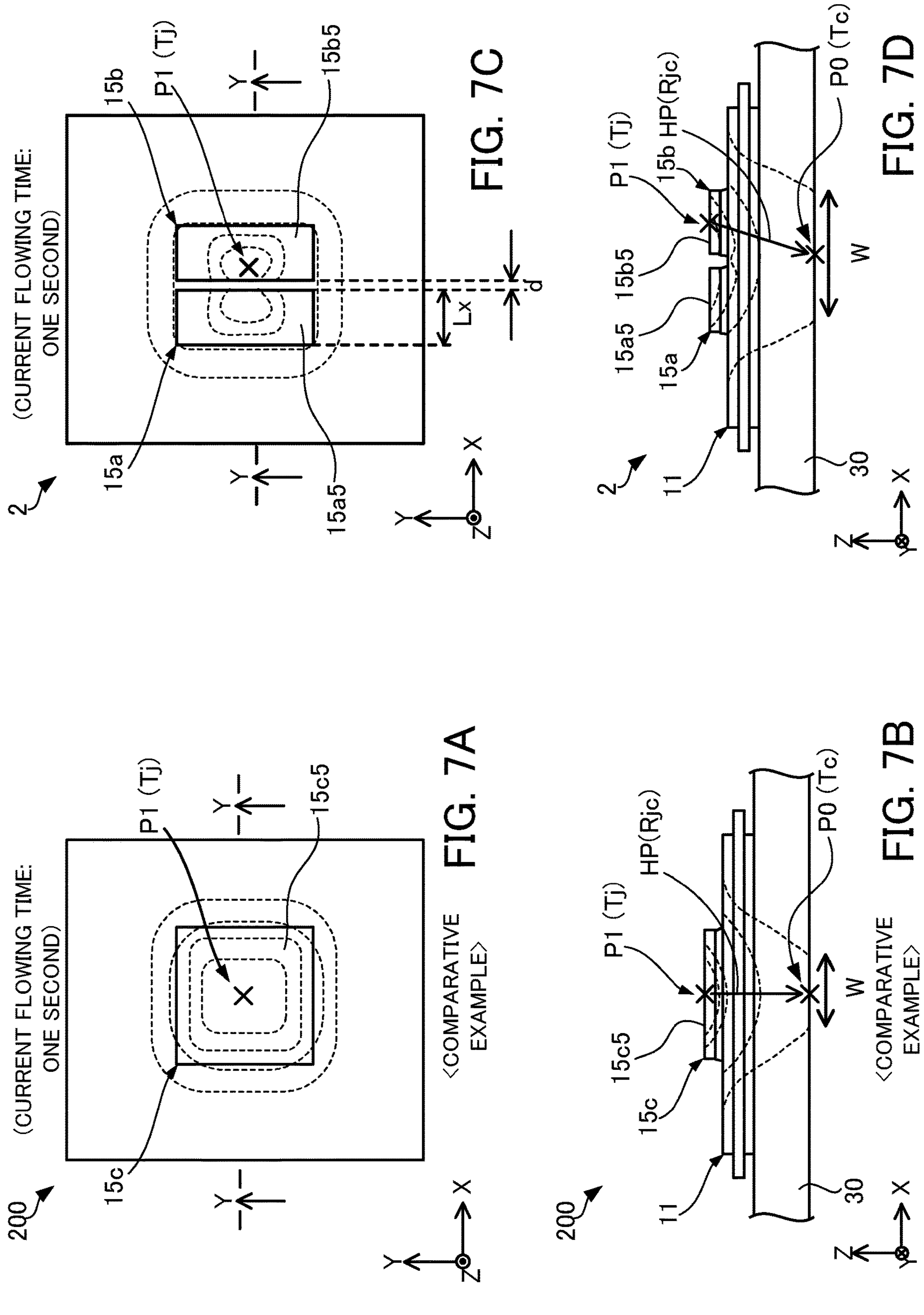
FIGS. 7A and 7B illustrate dispersion of the heat from a heated semiconductor chip.
FIGS. 7C and 7D illustrate dispersion of the heat from heated semiconductor chips.

Next, the thermal diffusion of the target devices 2 and 200 will be described with reference to FIGS. 7A to 7D. FIGS. 7A to 7D illustrate the thermal diffusion from heated semiconductor chips. FIGS. 7A and 7B schematically illustrate the thermal diffusion of the target device 200 according to the comparative example, and FIGS. 7C and 7D schematically illustrate the thermal diffusion of the target device 2. In this case, FIGS. 7A and 7C are plan views. FIG. 7B is a sectional view taken along a dashed-dotted line Y-Y in FIG. 7A, and FIG. 7D is a sectional view taken along a dashed-dotted line Y-Y in FIG. 7C.

In FIGS. 7A and 7B, the temperature distribution of the target device 200 including the heated semiconductor chip 15*c* is represented by dashed lines. In FIGS. 7C and 7D, the temperature distribution of the target device 2 including the heated semiconductor chips 15*a* and 15*b* is represented by dashed lines. Specifically, these temperature distributions are represented by level lines, which are dashed lines each connecting the same temperature points. A level line further away from the heat generation point P1 represents a lower temperature.

The temperature distribution of the target device 200 after a current is caused to flow through the target device 200 for one second will be described. First, when a current flows through the target device 200, the front surface 15*c*5 of the semiconductor chip 15*c* generates heat. Approximately the center of the front surface 15*c*5 exhibits the highest temperature. The highest temperature point is the heat generation point P1, and this temperature is a temperature Tj. In addition, the heat from the semiconductor chip 15*c* transfers, and the highest temperature point on the bottom surface 32 of the heat dissipation base board 30 is the heat dissipation point P0 and approximately faces the heat generation point P1. The temperature at this heat dissipation point P0 is a temperature Tc.

The heat generated from the semiconductor chip 15*c* of the target device 200 transfers from the heat generation point P1 toward the insulated circuit board 11 and the heat dissipation base board 30. As illustrated in FIG. 7A, regarding the temperature distribution in the plan view of the target device 200, a portion located further outside the heat generation point P1 exhibits a lower temperature. In addition, as illustrated in FIG. 7B, the temperature distribution in the sectional view in this case, a portion closer to the heat dissipation point P0 exhibits a lower temperature.

Next, the temperature distribution of the target device 2 after a current is caused to flow through the target device 2 for one second will be described. First, when a current flows through the target device 2, the front surfaces 15*a*5 and 15*b*5 of the semiconductor chips 15*a* and 15*b* generate heat. A portion somewhat away from the center of the front surface 15*a*5 in the direction of the side surface 15*a*4 exhibits the highest temperature. A portion somewhat away from the center of the front surface 15*b*5 in the direction of the side surface 15*b*2 exhibits the highest temperature. The individual highest temperature point is the heat generation point P1, and the temperature is the temperature Tj. FIG. 7C illustrates the heat generation point P1 with the semiconductor chip 15*b*. In addition, the heat transfers from the semiconductor chips 15*a* and 15*b*, and the highest temperature point on the bottom surface 32 of the heat dissipation base board 30 is the heat dissipation point P0. In the present simulation range, the heat dissipation point P0 approximately faces the midpoint between the semiconductor chips 15*a* and 15*b*. The temperature at the heat dissipation point P0 is the temperature Tc.

In the case of the target device 2, the heat generated from each of the semiconductor chips 15*a* and 15*b* transfers from the heat generation point P1 toward the insulated circuit board 11 and the heat dissipation base board 30. As illustrated in FIG. 7C, regarding the temperature distribution in the plan view of the target device 2, a portion located further outside the heat generation point P1 exhibits a lower temperature. In addition, in the case of the target device 2, it has been confirmed that the temperature Tj of the heat generation point P1 of the semiconductor chip 15*b* is lower than the temperature Tj of the target device 200. It is considered that this is because the semiconductor chips 15*a* and 15*b* are away from each other and less influence each other thermally, whereas assuming that the semiconductor chip 15*c* is a combination of the semiconductor chips 15*a* and 15*b*, these semiconductor chips 15*a* and 15*b* are very close to each other. The temperature Tj of the heat generation point P1 of the target device 2 is lower than the temperature Tj of the heat dissipation point P1 of the target device 200.

As illustrated in FIG. 7D, regarding the temperature distribution in the sectional view in this case, a portion closer to the heat dissipation point P0 from the heat generation point P1 exhibits a lower temperature. In addition, a temperature width W around the heat dissipation point P0 of the target device 2 is wider than a temperature width W around the heat dissipation point P0 of the target device 200. That is, it is considered that, since the semiconductor chips 15*a* and 15*b* of the target device 2 are away from each other by the distance d, the heat is less concentrated on the heat dissipation point P0 than the heat on the heat dissipation point P0 of the target device 200. In addition, the temperature Tc of the heat dissipation point P0 of the target device 2 is lower than the temperature Tc of the heat dissipation point P0 of the target device 200.

As described above, it has been determined that the temperature Tj of the heat generation point P1 and the temperature Tc of the heat dissipation point P0 of the target device 2 are lower than those of the target device 200. Thus, the thermal resistance of the target device 2 is less than that of the target device 200, and the heat dissipation of the target device 2 is better than that of the target device 200.

Taking the above results into account, the two semiconductor chips 15*a* and 15*b*, instead of the semiconductor chip 15*c*, are disposed away from each other by the distance d. In this way, it is possible to improve the heat dissipation without changing the characteristics and the construction of the semiconductor device 1 while maintaining the rated current. As a result, the thermal reliability of the semiconductor device 1 is improved.

Figure 8A:
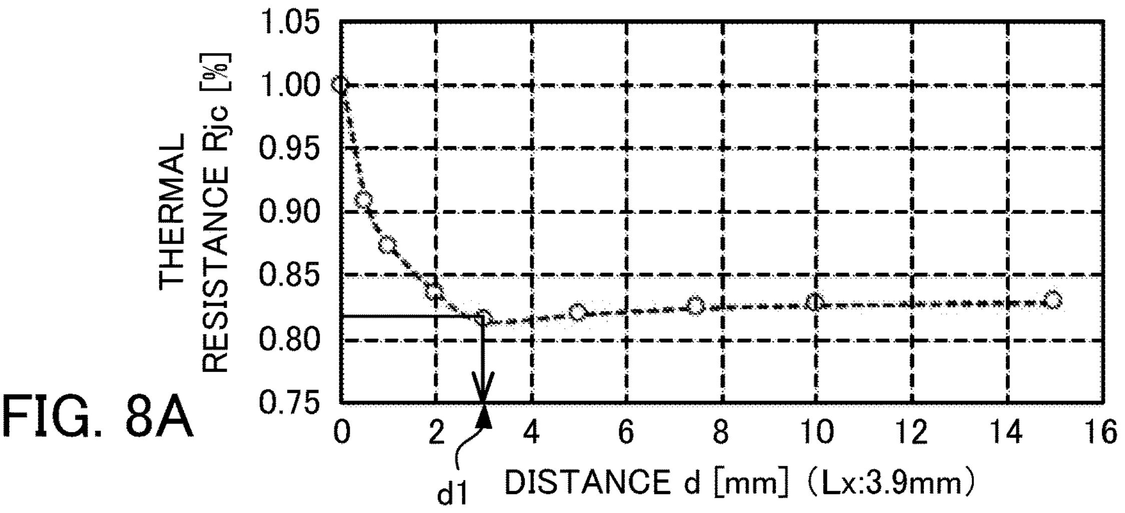
FIGS. 8A to 8C are graphs, each of which illustrates the thermal resistance with respect to the distance between semiconductor chips of a target device included in the semiconductor device according to the embodiment.
Figure 8B:
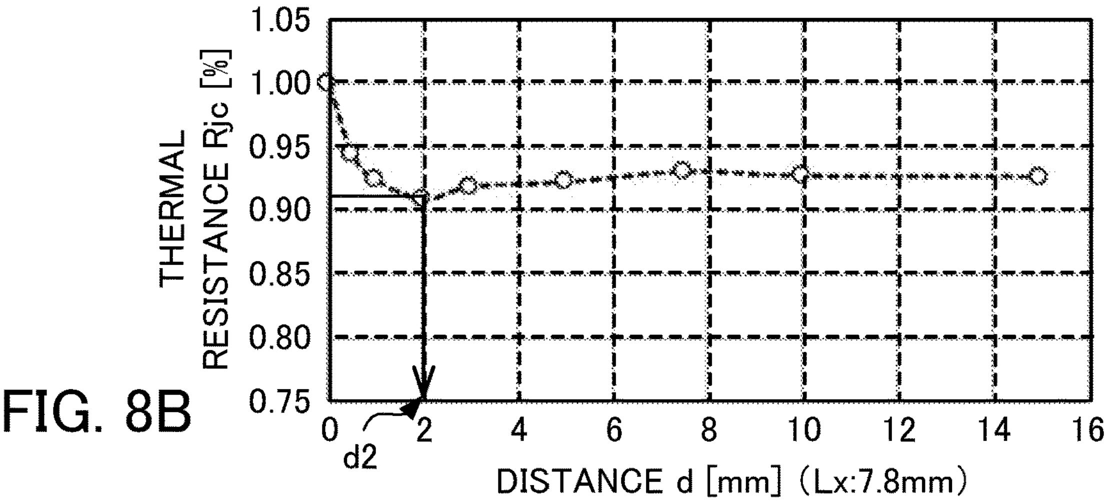
Figure 8C:
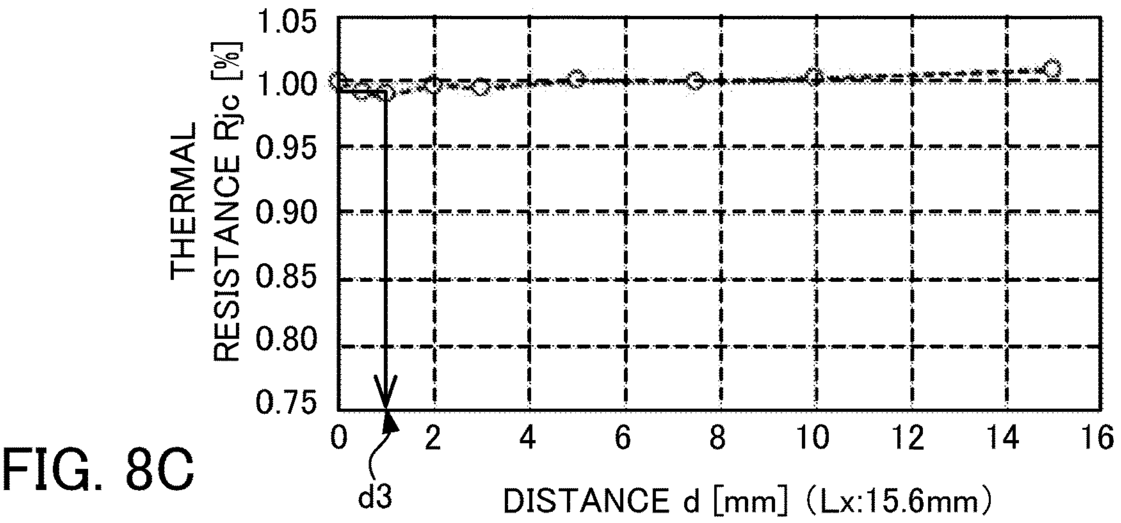

Next, an optimum range of the distance d between the semiconductor chips 15*a* and 15*b* will be discussed. First, how the thermal resistance of the target device 2 changes depending on the distance d will be described with reference to FIGS. 8A to 8C. In FIGS. 8A to 8C, different chip widths are used for the semiconductor chips 15*a* and 15*b*. FIGS. 8A to 8C are graphs, each of which illustrates the thermal resistance of a target device included in the semiconductor device according to the embodiment with respect to the distance between two semiconductor chips.

In the graphs in FIGS. 8A to 8C, the horizontal axis represents the distance d (mm) between the semiconductor chips 15*a* and 15*b* of the target device 2, and the vertical axis represents the thermal resistance. The thermal resistance obtained when the distance d is 0 mm is the thermal resistance obtained when the semiconductor chip 15*c* of the target device 200 is used. The chip width Lx of each of the semiconductor chips 15*a* and 15*b* is 3.9 mm, 7.8 mm, and 15.6 mm in FIGS. 8A to 8C, respectively.

FIGS. 8A to 8C indicate that the thermal resistance of the target device 2 begins to decrease from that of the target device 200 as the distance d between the semiconductor chips 15*a* and 15*b* increases. In each of FIGS. 8A to 8C, the thermal resistance decreases as the distance d increases. Once the thermal resistance reaches its minimum value, the thermal resistance begins to increase up to a certain value. Thereafter, the thermal resistance maintains the certain value even after the distance d further increases. A distance d_Rmin where the minimum thermal resistance is achieved is denoted by d1 to d3 in FIGS. 8A to 8C. Each of the distances d1 to d3 is about 2 mm (between 1 mm and 3 mm) and is about half the laminate thickness t.

FIG. 8A (chip width Lx=3.9 mm) indicates the greatest rate of decrease in thermal resistance with respect to the target device 200. FIG. 8C (chip width Lx=15.6 mm) indicates the least rate of decrease in thermal resistance with respect to the target device 200. Thus, it is considered that the thermal resistance becomes less when each of the semiconductor chips 15*a* and 15*b* has a smaller chip width Lx.

The length Ly of the semiconductor chips 15*a* and 15*b* was changed, and the thermal resistances then were measured and analyzed. For example, even when the length Ly of the semiconductor chips 15*a* and 15*b* was doubled, the same thermal resistances as in FIGS. 8A to 8C were obtained.

In the thermal resistance analysis simulation, the insulating plate 12 made of aluminum nitride was used. Even when the insulating plate 12 made of aluminum oxide was used, the thermal resistances similar to those obtained when the insulating plate 12 made of aluminum nitride was used in FIG. 8A to 8C were obtained.

In addition, even when the insulating plate 12 made of insulating resin was used, the same tendency in change of the thermal resistance as that in FIGS. 8A to 8C was exhibited. Even when the heat dissipation base board 30 was removed or even when sintered metal, instead of solder, was used as the bonding members 16*a*, 16*b*, and 16*c*, the same tendency in change of the thermal resistance as that in FIGS. 8A to 8C was exhibited.

Next, why the thermal resistance maintains a certain value even after the distance d increases will be described with reference to FIGS. 9A and 9B. FIGS. 9A and 9B schematically illustrate the thermal diffusion of the target device included in the semiconductor device according to the embodiment. The illustration of the insulated circuit board 11 of the target device 2 is simplified in FIGS. 9A and 9B. FIG. 9A schematically illustrates a case in which the distance d between the semiconductor chips 15*a* and 15*b* of the target device 2 is less than twice the laminate thickness t, and FIG. 9B schematically illustrates a case in which the distance d between the semiconductor chips 15*a* and 15*b* of the target device 2 is equal to or greater than twice the laminate thickness t.

As described above, the heat from the semiconductor chips 15*a* and 15*b* transfers mainly at 450 from their respective rear surfaces toward the bottom surface 32 of the heat dissipation base board 30 via the insulated circuit board 11 and the heat dissipation base board 30. The thermal diffusion portions 17*a* and 17*b* including the outer most areas 17*a*1 and 17*b*1, respectively, indicate the diffusion at 45° as described above.

When the distance d between the semiconductor chips 15*a* and 15*b* of the target device 2 is less than twice the laminate thickness t, as illustrated in FIG. 9A, the heat dissipation point P0 is affected by the heat that has transferred from both the semiconductor chips 15*a* and 15*b*, that is, affected by thermal interference. As the distance d increases, the influence of the thermal interference based on the heat that has transferred from both the semiconductor chips 15*a* and 15*b* decreases.

When the distance d between the semiconductor chips 15*a* and 15*b* of the target device 2 reaches twice the laminate thickness t or greater, as illustrated in FIG. 9B, the heat dissipation point P0 is little affected by the heat that has transferred from the semiconductor chip 15*a*. Thus, as the distance d increases, the thermal resistance maintains a certain value and increases little. Because of the above reason, the resistance value maintains a certain value after the distance d reaches twice the laminate thickness t or greater.

Figure 10:
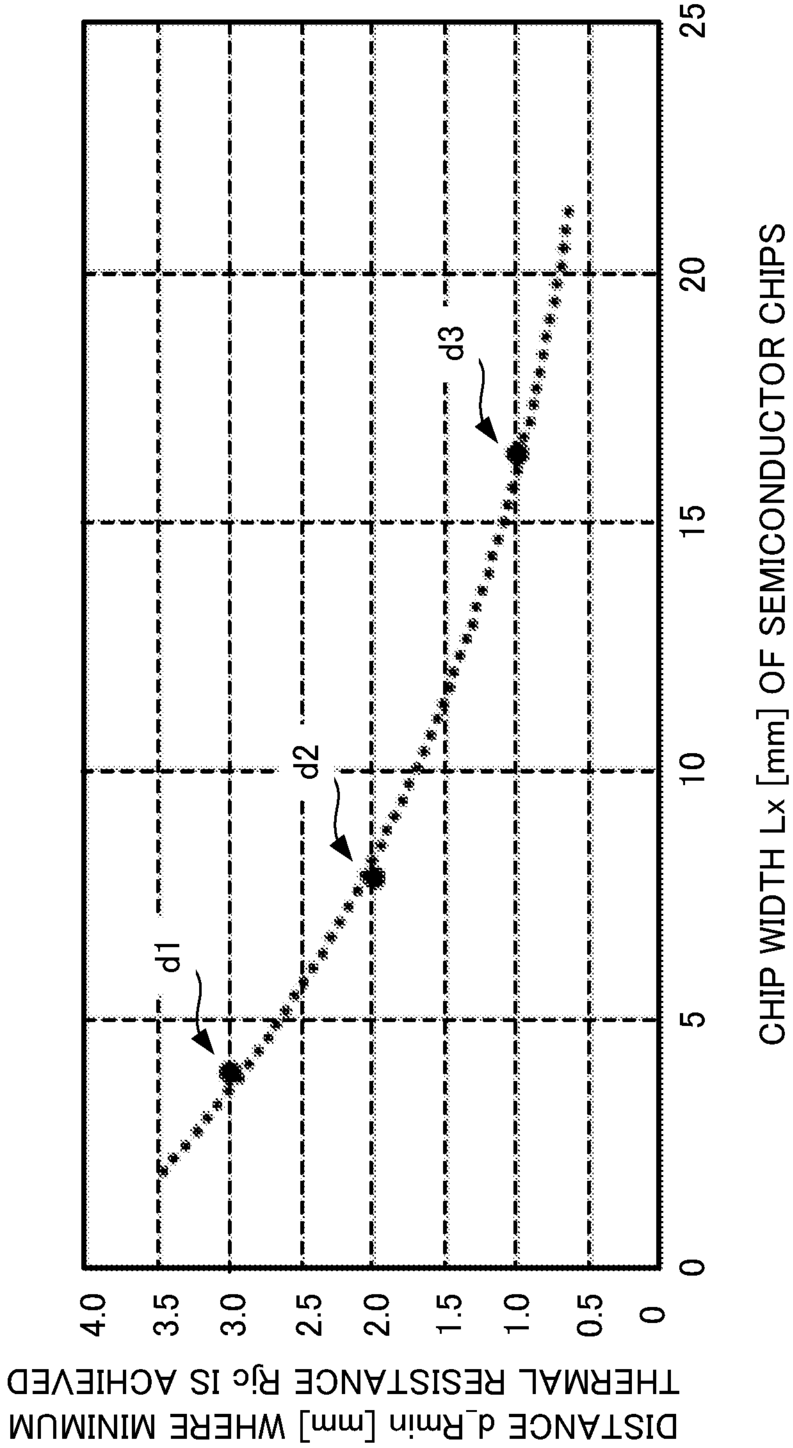
FIG. 10 is a graph illustrating the distance between semiconductor chips, where the minimum thermal resistance is achieved, with respect to the chip width of the semiconductor chips according to the embodiment.

Next, a relationship between the chip width Lx of the semiconductor chips 15*a* and 15*b* and the distance d_Rmin where the minimum thermal resistance is achieved will be described with reference to FIG. 10. FIG. 10 is a graph illustrating the distance between semiconductor chips, where the minimum thermal resistance is achieved, with respect to the chip width of the semiconductor chips according to the embodiment. The horizontal axis in FIG. 10 represents the chip width Lx (mm) of the semiconductor chips 15*a* and 15*b*, and the vertical axis represents the distance d_Rmin (mm) between the semiconductor chips 15$a$ and 15$b$, where the minimum thermal resistance is achieved.

That is, the graph in FIG. 10 illustrates points obtained by plotting the distances d1 to d3 illustrated in FIGS. 8A to 8C with respect to the chip width Lx of the semiconductor chips 15$a$ and 15$b$, and illustrates a fitted curve calculated by using the three points. The fitted curve indicating the distances d_Rmin where the minimum thermal resistances are achieved is obtained as follows.

$$d\_Rmin=4.1103\exp(-0.087*\text{chip width } Lx) \qquad (1)$$

Based on Equation (1), the distance d_Rmin where the minimum thermal resistance is achieved is obtained from the chip width Lx of the semiconductor chips 15$a$ and 15$b$. In view of the above description, for example, the range of the distance d in which the target device 2 (the semiconductor device 1) has a small thermal resistance may be set as follows.

$$(d\_Rmin/2)<\text{distance } d<((d\_t2+d\_Rmin)/2)) \qquad (2)$$

"d_t2" is the distance d twice the laminate thickness t.

Thus, by setting the distance d between the semiconductor chips 15$a$ and 15$b$ disposed on the insulated circuit board 11 at least within the range expressed by Equation (2), it is possible to reduce the thermal resistance of the target device 2 (the semiconductor device 1).

Conventionally, there is a case in which, instead of a single semiconductor chip, a plurality of semiconductor chips, each of which is smaller than the single semiconductor chip, are disposed in parallel. In this case, more semiconductor chips are obtained from a wafer. In addition, such parallel arrangement improves the mounting property in a limited area. However, in this case, the distance between neighboring semiconductor chips needs to be reduced as much as possible. The distance is, for example, 1 mm or less.

In addition, if a plurality of semiconductor chips are disposed in parallel, by increasing the distance between neighboring semiconductor chips as described above, it is possible to reduce the thermal resistance of the semiconductor device including the plurality of semiconductor chips, whereby the heat dissipation is improved. The distance in this case is, for example, 4 mm or more, although the distance depends on the chip width Lx of the individual semiconductor chip.

Unlike these conventional techniques, the semiconductor device 1 (the target device 2) is not obtained by simply replacing the semiconductor chip 15$c$ by the semiconductor chips 15$a$ and 15$b$, which have a narrowed or widened distance therebetween and which are arranged in parallel. The semiconductor chips 15$a$ and 15$b$ are disposed away from each other with the distance d within the range set by using Equation (2), where the distance d_Rmin is obtained from Equation (1). As a result, the thermal resistance of the semiconductor device 1 (the target device 2) is reduced. Thus, by disposing the semiconductor chips 15$a$ and 15$b$ away from each other with the distance d in place of the semiconductor chip 15$c$, it is possible to improve the heat dissipation without changing the characteristics and the construction of the semiconductor device 1 while maintaining the rated current. As a result, the thermal reliability of the semiconductor device 1 is improved.

The above semiconductor device 1 includes the insulated circuit board 11, the heat dissipation base board 30, the semiconductor chips 15$a$ and 15$b$. The semiconductor chip 15$a$ has the rectangular front surface 15$a$5 and the side surface 15$al$ that constitutes one of the four sides of the front surface 15$a$5 in plan view and that has the predetermined chip width Lx. The semiconductor chip 15$a$ is bonded to the front surface of the insulated circuit board 11 with the side surface 15$al$ facing in the −Y direction, for example. The semiconductor chip 15$b$ has the rectangular front surface 15$b$5 and the side surface 15$b$1 that constitutes one of the four sides of the front surface 15$b$5 in plan view and that has the chip width Lx. The semiconductor chip 15$b$ is bonded to the front surface of the insulated circuit board 11 with the side surface 15$b$1 facing in the −Y direction and with the distance d from the semiconductor chip 15$a$ in the +X direction (a second direction) perpendicular to the −Y direction (the first direction).

In addition, the semiconductor chip 15$b$ has the heat generation point P1 on the front surface 15$b$5, and the heat dissipation base board 30 has the heat dissipation point P0 on the bottom surface 32, the heat dissipation point P0 being directly under a midpoint between the semiconductor chips 15$a$ and 15$b$ in side view. The heat dissipation path HP is formed from the heat generation point P1 to the heat dissipation point P0, and the lower limit of the distance d is set based on the distance (d_Rmin) where the minimum thermal resistance of the heat dissipation path HP is achieved with respect to the chip width Lx. By disposing the semiconductor chips 15$a$ and 15$b$ on the front surface of the insulated circuit board 11 with the distance d set as described above, the thermal resistance is reduced, and as a result, the heat dissipation of the semiconductor device 1 is improved. Thus, deterioration in reliability of the semiconductor device 1 is prevented.

The disclosed technique reduces the thermal resistance, improves the heat dissipation, and prevents deterioration in reliability of the semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:

a board which has a top surface and a bottom surface that is opposite to the top surface;

a first semiconductor chip which has a rectangular first front surface and a first side surface that constitutes one of four sides of the first front surface in a plan view of the semiconductor device, the first semiconductor chip being bonded to the top surface of the board with the first side surface facing in a first direction, the first side surface having a predetermined chip width in a second direction perpendicular to the first direction; and a second semiconductor chip which has a rectangular second front surface and a second side surface that constitutes one of four sides of the second front surface in the plan view, the second semiconductor chip being bonded to the top surface of the board with the second side surface facing in the first direction, the second side surface having the predetermined chip width in the second direction, wherein the first and second semiconductor chips are disposed away from each other by a chip distance in the second direction, and a lower limit of the chip distance is set based on a first distance, where a minimum thermal resistance of a heat dissipation path from a heat generation point on the first front surface of the first semiconductor chip to a heat dissipation point on the bottom surface of the board is achieved with respect to the chip width, the heat dissipation point being positioned at the bottom surface of the board directly below a midpoint between the first and second semiconductor chips in the second direction in a side view of the semiconductor device.

2. The semiconductor device according to claim 1, wherein the first semiconductor chip and the second semiconductor chip each include a same element, the first front surface of the first semiconductor chip and the second front surface of the second semiconductor chip have a same shape and a same area size in the plan view, and the first semiconductor chip and the second semiconductor chip have a same thickness.

3. The semiconductor device according to claim 2, wherein the same element included in the first semiconductor chip and the second semiconductor chip is an insulated gate bipolar transistor or a metal-oxide-semiconductor field-effect transistor.

4. The semiconductor device according to claim 1, wherein the semiconductor device has a laminate thickness from the bottom surface of the board to the first front surface of the first semiconductor chip in the side view, and the chip distance is equal to or less than an upper limit that is set based on the first distance and a second distance that is twice the laminate thickness.

5. The semiconductor device according to claim 1, wherein the thermal resistance of the heat dissipation path is calculated from a difference between a temperature at the heat generation point and a temperature at the heat dissipation point, and the first distance is obtained from a fitted curve, the fitted curve being set so as to pass through respective minimum thermal resistances of the heat dissipation path obtained by varying the chip width.

6. The semiconductor device according to claim 1, wherein the board includes a heat dissipation board and an insulating board provided on a front surface of the heat dissipation board via a first bonding member, and the first semiconductor chip and the second semiconductor chip are bonded to a front surface of the insulating board, which is the top surface of the board, via a second bonding member.

7. The semiconductor device according to claim 6, wherein solder is a main component of the first bonding member and the second bonding member.

8. The semiconductor device according to claim 6, wherein the insulating board includes an insulating plate, a metal plate provided on a rear surface of the insulating plate, and one or more conductive plates provided on the front surface of the insulating plate.

9. The semiconductor device according to claim 8, wherein the first semiconductor chip and the second semiconductor chip are bonded to a front surface of a same conductive plate.

10. The semiconductor device according to claim 8, wherein a ceramic material or a resin material is a main component of the insulating plate.

* * * * *